(12) United States Patent
Munetaka et al.

(10) Patent No.: US 8,357,577 B2
(45) Date of Patent: Jan. 22, 2013

(54) MANUFACTURING METHOD OF SEMICONDUCTOR DEVICE HAVING VERTICAL TYPE TRANSISTOR

(75) Inventors: Yuki Munetaka, Tokyo (JP); Yoshihiro Takaishi, Tokyo (JP)

(73) Assignee: Elpida Memory, Inc., Tokyo (JP)

( * ) Notice: Subject to any disclaimer, the term of this patent is extended or adjusted under 35 U.S.C. 154(b) by 0 days.

(21) Appl. No.: 13/253,100

(22) Filed: Oct. 5, 2011

(65) Prior Publication Data

US 2012/0100682 A1    Apr. 26, 2012

(30) Foreign Application Priority Data

Oct. 22, 2010    (JP) ................................ 2010-237012

(51) Int. Cl.
*H01L 21/336* (2006.01)
(52) U.S. Cl. ................... 438/268; 438/270; 257/E21.41
(58) Field of Classification Search .................. 438/268, 438/270; 257/E21.41
See application file for complete search history.

(56) References Cited

U.S. PATENT DOCUMENTS

| 7,872,301 B2 * | 1/2011 | Takaishi | 257/328 |
| 8,174,068 B2 * | 5/2012 | Nojima | 257/336 |
| 2008/0283907 A1 | 11/2008 | Takaishi | |
| 2011/0263099 A1 * | 10/2011 | Nojima | 438/478 |

FOREIGN PATENT DOCUMENTS

JP    2008-288391    11/2008

* cited by examiner

*Primary Examiner* — Trung Q Dang
(74) *Attorney, Agent, or Firm* — Young & Thompson

(57) ABSTRACT

A manufacturing method of a semiconductor device includes the steps of: forming an insulating pillar on the main surface of a silicon substrate; forming a protective film on the side surface of the insulating pillar; forming a silicon pillar on the main surface of the silicon substrate; forming a gate insulating film on the side surface of the silicon pillar; and forming first and second gate electrodes so as to contact each other and so as to cover the side surfaces of the silicon pillar and insulating pillar, respectively. According to the present manufacturing method, the protective film is formed on the side surface of the insulating pillar as a dummy pillar, thus preventing the dummy pillar from being eroded when the silicon pillar for channel is processed into a transistor. Therefore, it is possible to reduce a probability of occurrence of gate electrode disconnection.

10 Claims, 10 Drawing Sheets

MANUFACTURING METHOD OF SEMICONDUCTOR DEVICE HAVING VERTICAL TYPE TRANSISTOR

BACKGROUND OF THE INVENTION

1. Field of the Invention

The present invention relates to a manufacturing method of a semiconductor device and, more particularly, to a manufacturing method of a semiconductor device in which a dummy pillar for extending a gate electrode of a transistor in the lateral direction is formed of a silicon oxide film.

2. Description of Related Art

The chip size of a semiconductor device, especially, that of a memory device is reduced year by year for cost reduction. Accordingly, in a DRAM (Dynamic Random Access Memory), a vertical type transistor having a $4F^2$ structure is now being adopted as a cell transistor. Regarding a transistor for peripheral circuit, since requirements for size reduction are not stringent than in the case of the cell transistor, a conventional planar type transistor is still continuously being adopted. However, in the case where the transistor structure differs in the cell and peripheral circuit, the number of processes significantly increases. Thus, recently, adoption of a vertical type transistor having a $4F^2$ structure also as the transistor for peripheral circuit is under consideration (refer to Japanese Patent Application Laid-Open No. 2008-288391).

As disclosed in Japanese Patent Application Laid-Open No. 2008-288391, in the vertical type transistor installed in a peripheral circuit, two adjacent silicon pillars (first and second silicon pillars) are used. The first silicon pillar is used as a channel. Impurity diffusion layers are formed respectively at the upper and lower portions of the first silicon pillar. The side surface of the first silicon pillar is covered by a gate electrode through a gate insulating film. The second silicon pillar is a dummy pillar used for extending the length of the gate electrode in the lateral direction, and a gate contact plug is provided in the extended portion.

In recent years, a technique that forms a dummy pillar using an insulating film such as a silicon oxide film is proposed. This technique aims to prevent short circuit between a silicon substrate and a gate contact plug and functions well in this regard. However, this technique has a high probability of occurrence of gate electrode disconnection.

This will be explained more concretely taking a case where the dummy pillar is formed of a silicon oxide film as an example. A process for processing a silicon pillar for a channel as a transistor includes a process of intentionally or incidentally eroding the silicon oxide film, such as wet etching and acid washing with phosphoric acid or hydrofluoric acid. In the case where the dummy pillar is formed of the silicon oxide film, the dummy pillar is eroded through the above process. As a result, the diameter of the dummy pillar is reduced to increase the distance between the surface of the silicon pillar and the surface of the dummy pillar, resulting in insufficient integration of gate electrodes covering the side surfaces of the silicon pillar and the dummy pillar.

SUMMARY

In one embodiment, there is provided a manufacturing method of a semiconductor device, comprising: forming an insulating pillar on the main surface of a silicon substrate; forming a protective film on the side surface of the insulating pillar; forming a silicon pillar on the main surface of the silicon substrate; forming a gate insulating film on the side surface of the silicon pillar; and forming first and second gate electrodes contacting each other and covering the side surfaces of the silicon pillar and insulating pillar, respectively.

According to the present invention, the protective film is formed on the side surface of the insulating pillar as a dummy pillar, thus preventing the dummy pillar from being eroded when the silicon pillar for channel is processed into a transistor. Therefore, it is possible to reduce a probability of occurrence of gate electrode disconnection.

BRIEF DESCRIPTION OF THE DRAWINGS

The above and other features and advantages of the present invention will be more apparent from the following description of certain preferred embodiments taken in conjunction with the accompanying drawings, in which.

DETAILED DESCRIPTION OF THE EMBODIMENTS

Preferred embodiments of the present invention will be explained below in detail with reference to the accompanying drawings.

Figure 1A:
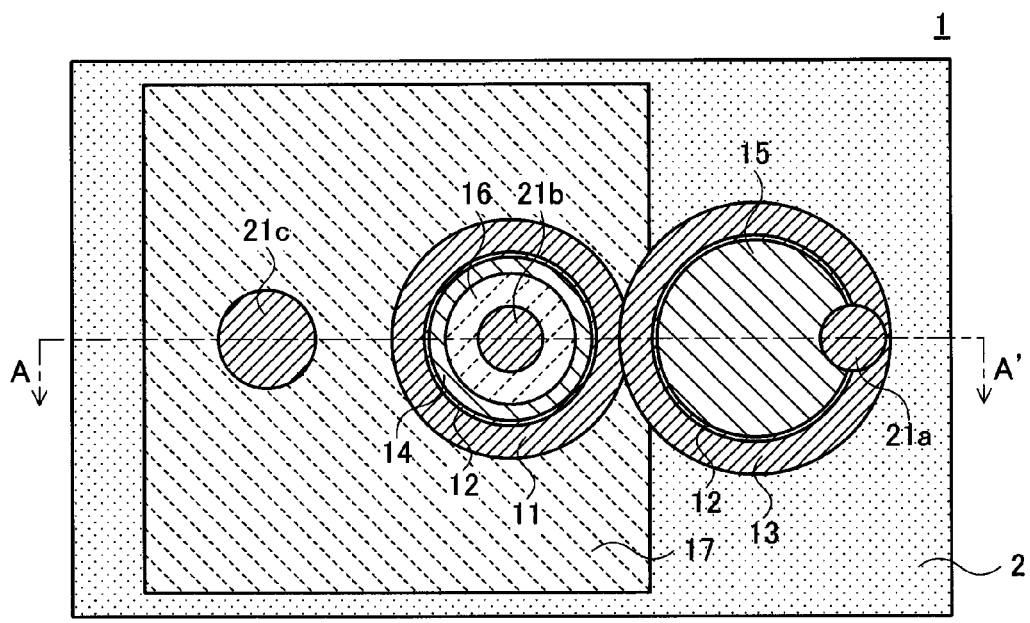
FIG. 1A is a top view of a semiconductor device manufactured by a semiconductor device manufacturing method according to an embodiment of the present invention.
Figure 1B:
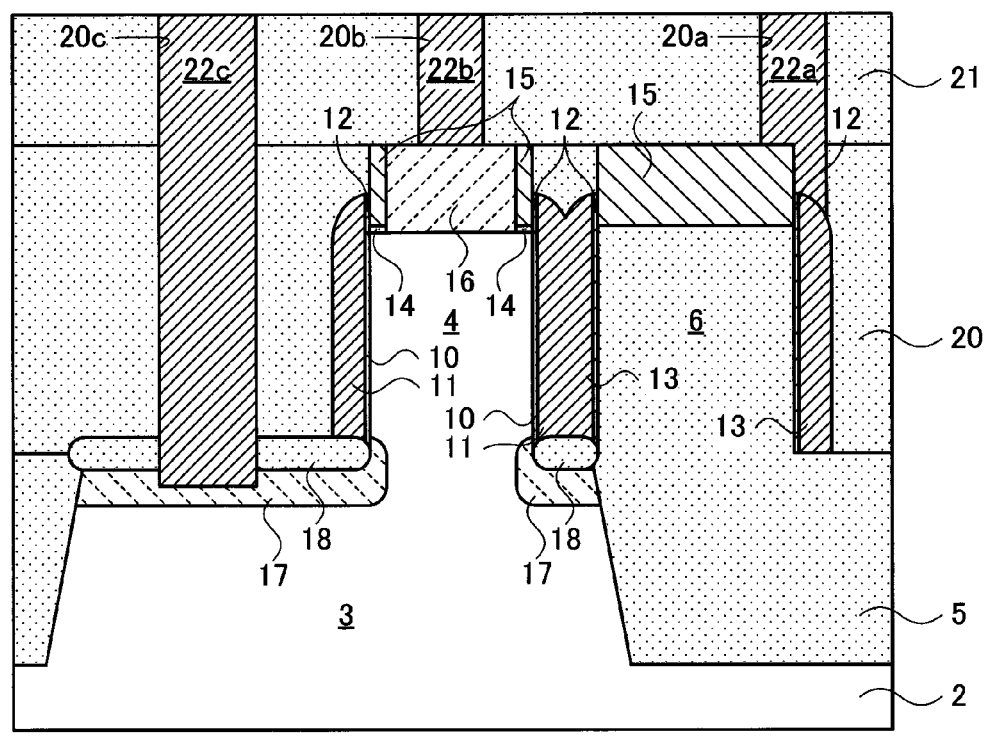
FIG. 1B is a cross-sectional view taken along the A-A' line of FIG. 1A.

FIGS. 1A and 1B are views each illustrating a structure of a semiconductor device 1 manufactured by a semiconductor device manufacturing method according to an embodiment of the present invention. FIG. 1A is a top view, and FIG. 1B is a cross-sectional view taken along the A-A' line of FIG. 1A. In FIG. 1A, some constituent elements of the semiconductor device 1 are transparently illustrated.

As illustrated in FIGS. 1A and 1B, the semiconductor device 1 includes a silicon substrate 2, a primary silicon pillar 3 formed on the surface of the silicon substrate 2, a secondary silicon pillar 4 formed on the upper surface of the primary silicon pillar 3, an element isolation region (STI region) 5 formed around the primary silicon pillar 3, and a silicon oxide film pillar 6 (insulating pillar) formed on the upper surface of the STI region 5. The above pillars are all formed perpendicular to the main surface of the silicon substrate 2.

FIGS. 1A and 1B each illustrate a vertical type MOS (Metal-Oxide-Semiconductor) transistor used in a peripheral circuit of a DRAM. The secondary silicon pillar 4 constitutes a channel of the vertical type MOS transistor, and silicon oxide film pillar 6 constitutes a dummy pillar for extending a gate electrode of the MOS transistor in the lateral direction. The STI region 5 is formed so as to define the active region by an STI method (Shallow Trench Isolation method) and is formed of a silicon oxide film.

The side surface of the secondary silicon pillar 4 is covered by a gate insulating film 10, and the outer surface of the gate insulating film 10 is covered by a first gate electrode 11. The side surface of the silicon oxide film pillar 6 is covered by a protective film 12, and the outer surface of the protective film 12 is covered by a second gate electrode 13. The first gate electrode 11 and second gate electrode 13 contact each other in the region between the secondary silicon pillar 4 and the silicon oxide film pillar 6 and are integrated with each other to thereby constitute the gate electrode of the MOS transistor. The details of the protective film 12 will be described later.

A silicon nitride film 15 is formed on the upper surface of the secondary silicon pillar 4 through a thin silicon oxide film 14 for protection. The silicon nitride film 15 is also formed on the upper surface of the silicon oxide film pillar 6 and covers the entire upper surface of the silicon oxide film pillar 6. The silicon nitride film 15 is a residue of a silicon nitride film which is used as a hard mask in the formation of the secondary silicon pillar 4 and silicon oxide film pillar 6.

A through hole which exposes the upper surface of the secondary silicon pillar 4 is formed in the silicon oxide film 14 and silicon nitride film 15 formed on the upper surface of the secondary silicon pillar 4. Inside the through hole, an upper diffusion layer 16 which contacts the upper portion of the secondary silicon pillar 4 is formed. The upper diffusion layer 16 is formed by selectively and epitaxially growing silicon on the upper surface of the secondary silicon pillar 4 and ion-implanting, in the silicon, impurities having an opposite conductive type to impurities in the silicon substrate 2.

A lower diffusion layer 17 which contacts the lower portion of the secondary silicon pillar 4 is formed on a region of the upper surface of the primary silicon pillar 3 around the secondary silicon pillar 4. The lower diffusion layer 17 is formed by ion-implanting, through a silicon oxide film 18 formed on a region of the upper surface of the primary silicon pillar 3 around the secondary silicon pillar 4, impurities having an opposite conductive type to impurities in the silicon substrate 2.

The secondary silicon pillar 4, silicon oxide film pillar 6, and first and second gate electrode 11 and 13 are covered by an interlayer insulating film constituted by silicon oxide films 20 and 21. Three contact holes 20a to 20c are formed in the interlayer insulating film. The second gate electrode 13, upper diffusion layer 16, and lower diffusion layer 17 are exposed to the bottom surfaces of the three contact holes 20a to 20c, respectively. Conductive materials are buried respectively in the contact holes 20a to 20c to constitute a gate contact plug 22a, an upper diffusion layer contact plug 22b, and a lower diffusion layer contact plug 22c.

With the above configuration, the upper diffusion layer 16 functions as one of the source and drain of the MOS transistor, and the lower diffusion layer 17 functions as the other one of the source and drain of the MOS transistor. The channel of the MOS transistor is formed inside the secondary silicon pillar 4 located between the upper diffusion layer 16 and lower diffusion layer 17. The gate/source/drain of the transistor are connected to a not-illustrated upper layer wiring pattern by the contact plugs 22a to 22c, respectively.

The ON/OFF control of the vertical type MOS transistor is performed by means of an electrical field applied to the first gate electrode 11 through the gate contact plug 22a and second gate electrode 13. When voltage equal to or higher than a threshold voltage of the vertical type MOS transistor is applied to the gate contact plug 22a, a channel is formed inside the secondary silicon pillar 4 to electrically connect the upper diffusion layer 16 and the lower diffusion layer 17, with the result that the vertical type MOS transistor is turned ON. When voltage lower than a threshold voltage of the vertical type MOS transistor is applied to the gate contact plug 22a, the channel inside the secondary silicon pillar 4 is eliminated to electrically isolate the upper diffusion layer 16 and the lower diffusion layer 17 from each other, with the result that the vertical type MOS transistor is turned OFF.

Next, the protective film 12 will be described in detail. The protective film 12 differs from the silicon oxide film in etching condition. Concretely, it is preferable that the protective film 12 is formed of a material less eroded by phosphoric acid or hydrofluoric acid than the silicon oxide film and a material that is not etched by the wet etching applied to the silicon oxide film (material having a lower etching rate for wet etching applied to the silicon oxide film than the etching rate of the silicon oxide film). Examples of such a material include an insulating film other than the silicon oxide film, such as a silicon nitride film and a conductive film such as polysilicon or tungsten.

Although the details will be described later, a manufacturing process of the semiconductor device 1 includes a process of intentionally or incidentally eroding the silicon oxide film. An example of the intentional erosion includes wet etching of the silicon oxide film, and an example of the incidental erosion includes washing (acid washing) with phosphoric acid or hydrofluoric acid. In a conventional semiconductor device, the silicon oxide film serving as a dummy pillar is eroded through the above erosion process, with the result that the first gate electrode 11 and the second gate electrode 13 are isolated from each other to cause gate electrode disconnection. On the other hand, in the semiconductor device 1, the side surface of the silicon oxide film pillar 6 is covered by the protective film 12, which prevents the silicon oxide film pillar 6 from being eroded in the above erosion process. Thus, a probability of occurrence of the gate electrode disconnection is reduced.

A manufacturing method of the semiconductor device 1 according to the present embodiment will be described in detail below.

FIGS. 2 to 9 are process views for explaining a manufacturing method of the semiconductor device 1 according to the present embodiment. Each of FIGS. 2 to 9 is a cross-sectional view of the semiconductor device 1 corresponding to a cross-section taken along the A-A' line of FIG. 1A.

Figure 2:
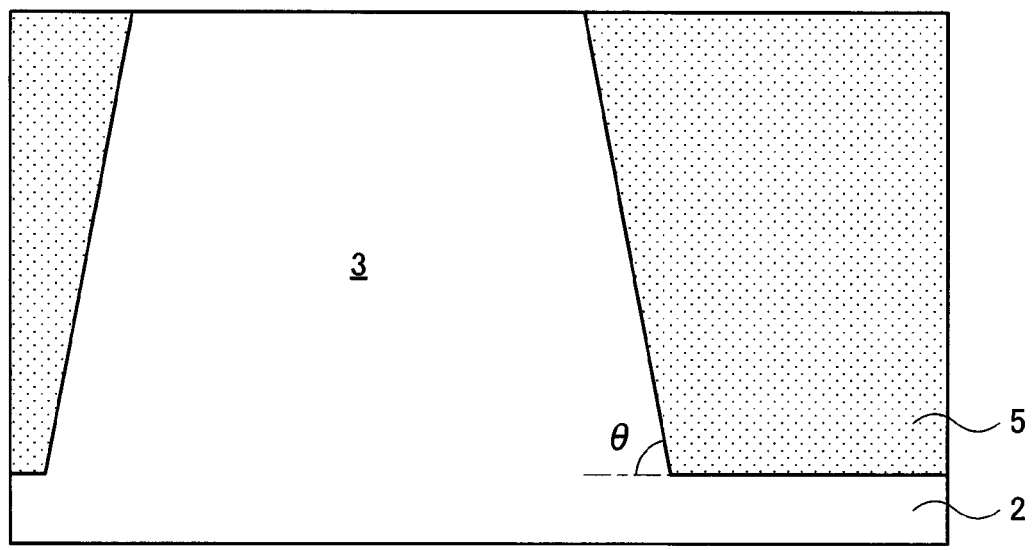
FIGS. 2 to 9 are process views for explaining a manufacturing method of the semiconductor device according to the embodiment of the present invention.

First, in the manufacturing process of the semiconductor device 1, the silicon substrate 2 is prepared, and the primary silicon pillar 3 illustrated in FIG. 2 is formed on the main surface of the silicon substrate 2. Preferably, the height of the primary silicon pillar 3 is set to about 300 nm.

The primary silicon pillar 3 is formed by cutting the main surface of the silicon substrate 2 except for a region where the primary silicon pillar 3 is formed using dry etching method. An etching condition at this time is set such that the side surface of the primary silicon pillar 3 is tapered. The tapered angle θ (angle between the side surface of the primary silicon pillar 3 and a horizontal plane) is set to such a degree that the protective film 12 of the side surface of the primary silicon pillar 3 is sufficiently removed by anisotropic etch back of the protective film 12 to be described later. Concretely, the angle θ is preferably set to not less than 85° and not more than 88°. The lower limit value 85° of the angle θ is determined based on the intended purpose of forming the dummy pillar using the silicon oxide film, that is, from the view point of preventing short circuit between the silicon substrate 2 and the gate contact plug 22a. In order to realize such an angle θ, plasma etching with CI-based gas is preferably used.

Subsequently, a thin silicon oxide film is formed by thermal oxidation at about 1000° C. on the entire surface of the silicon substrate 2, and then a silicon oxide film having a thickness of 400 nm to 500 nm is deposited by a CVD (Chemical Vapor Deposition) method on the entire surface of the silicon substrate 2. Then, the surface of the silicon oxide film is flattened by CMP (Chemical Mechanical Polishing) so as to align the height of the upper surface of the silicon oxide film with the upper surface of the primary silicon pillar 3.

Thus, as illustrated in FIG. 2, the STI region 5 formed of the silicon oxide film (insulating film) is formed around the primary silicon pillar 3.

Subsequently, the silicon oxide film 14 for protection having a small thickness is formed on the entire surface of the silicon substrate 2, and silicon nitride film 15 is formed on the upper surface of the thin silicon oxide film 14 for protection. Although not particularly limited, the silicon oxide film 14 and silicon nitride film 15 may be formed by a CVD method and the thicknesses thereof are preferably set to about 5 nm and about 120 nm, respectively.

Figure 3:
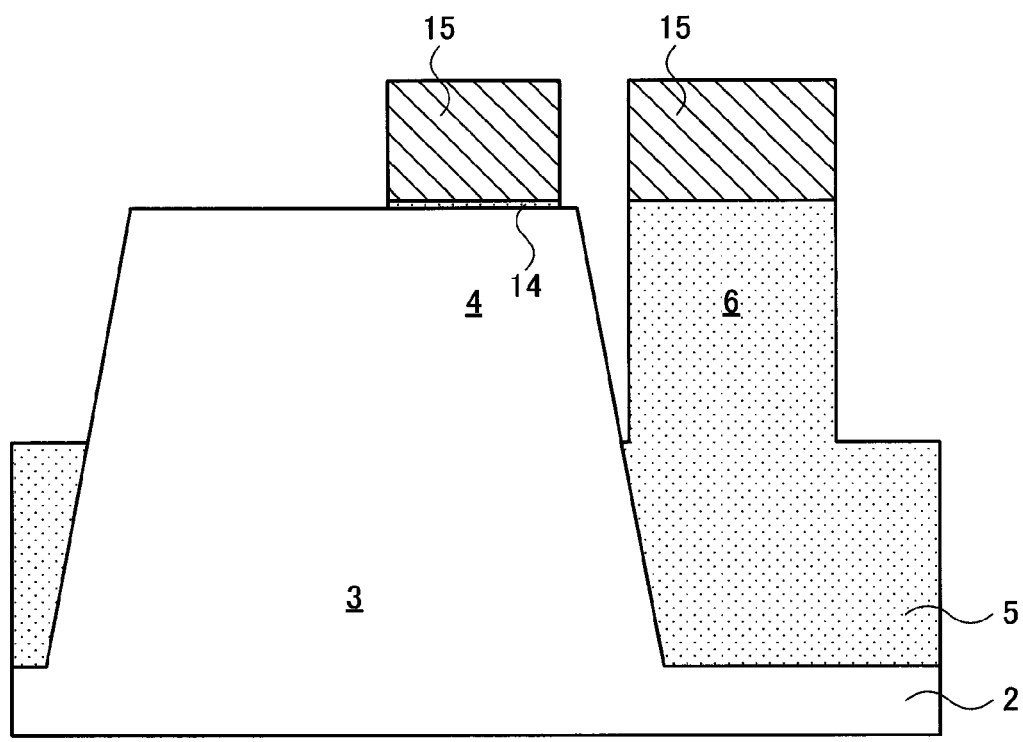

Further, the silicon oxide film 14 and the silicon nitride film 15 are patterned to remove these films in a region other than a region where the secondary silicon pillar 4 and silicon oxide film pillar 6 are to be formed (FIG. 3). Then, the silicon oxide film is selectively etched using the silicon nitride film 15 as a mask pattern to form the silicon oxide film pillar 6 as illustrated in FIG. 3.

The inclination of the side surface of the silicon oxide film pillar 6 relative to the horizontal plane is preferably brought close to 90° as much as possible. The reason for this is to prevent the protective film 12 formed on the side surface of the silicon oxide film pillar 6 from being removed by anisotropic etch back of the protective film 12 to be described later. The height of the silicon oxide film pillar 6 is preferably set to about 100 nm. Further, the distance between the silicon oxide film pillar 6 formed at this time and secondary silicon pillar 4 formed subsequently is preferably set to about 50 μm in the shortest distance between the surfaces thereof. This distance is set considering the film thicknesses of the first and second gate electrodes 11 and 13 such that the first and second gate electrodes 11 and 13 are sufficiently integrated with each other.

Figure 4:
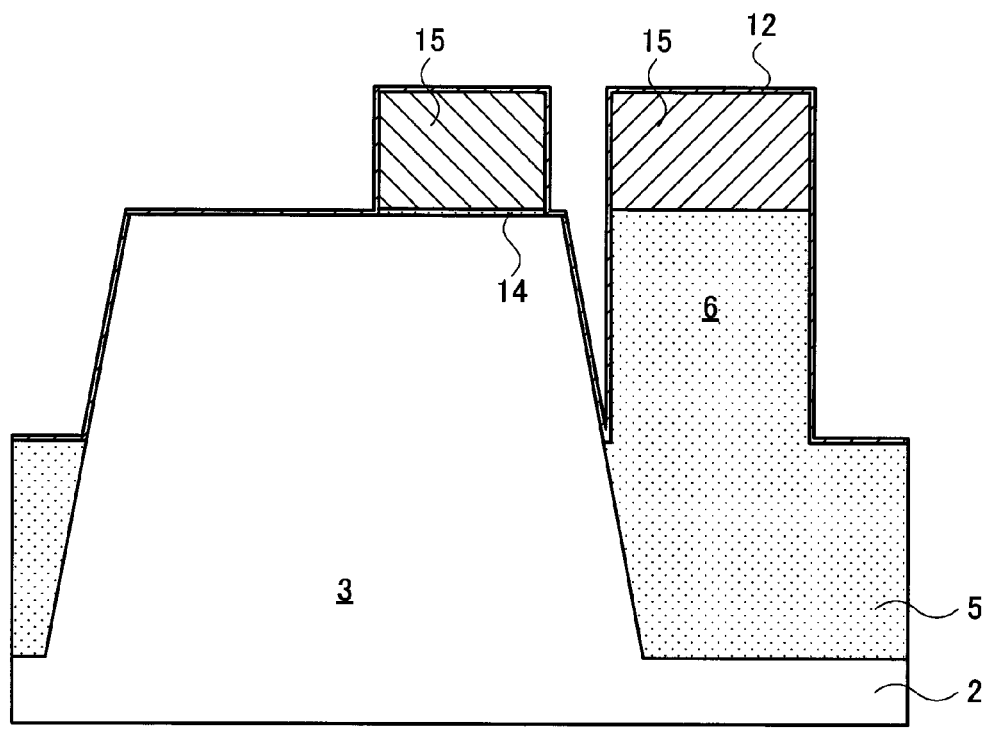

Then, as illustrated in FIG. 4, the protective film 12 is formed on the entire surface of the silicon substrate 2. The film formation amount of the protective film 12 is preferably set such that the film thickness of a part of the protective film 12 that is formed on the side surface of the silicon oxide film pillar 6 is about 5 nm. As described above, the protective film 12 is formed of a material different from the silicon oxide film in etching condition. Concretely, it is preferable that the protective film 12 is formed of an insulating film such as a silicon nitride film or a conductive film such as polysilicon.

Figure 5:
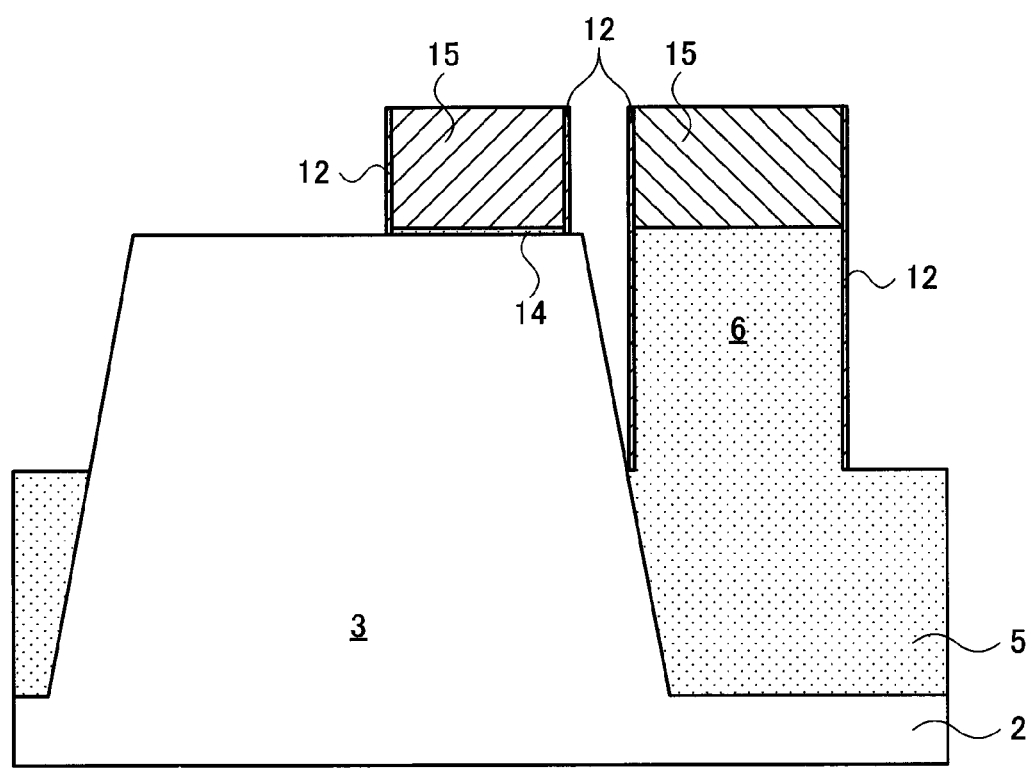
Figure 10:
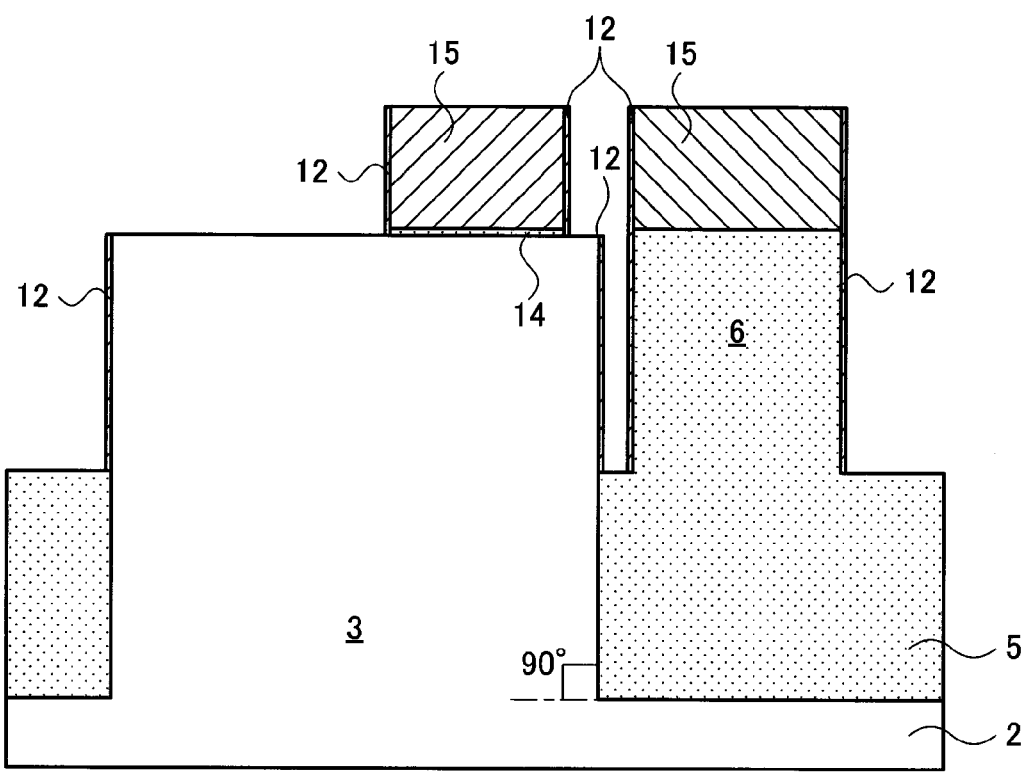
FIG. 10 is a cross-sectional view illustrating the semiconductor device according to a comparative example of the present invention in the manufacturing process thereof.

Subsequently, anisotropic dry etch back is applied to the protective film 12 to remove the protective film 12 formed on the flat portion. Consequently, as illustrated in FIG. 5, a side wall protective film 12 is formed. Since the side surface of the primary silicon pillar 3 is processed in a tapered shape in the semiconductor device 1, the protective film 12 is not left on the side surface of the primary silicon pillar 3 at this time. FIG. 10 is a comparative example of the semiconductor device 1, which illustrates an example in which the side surface of the primary silicon pillar 3 is made vertical (θ=90°). As illustrated in FIG. 10, when the side surface of the primary silicon pillar 3 is not tapered, the protective film 12 is left on the side surface of the primary silicon pillar 3.

Figure 6:
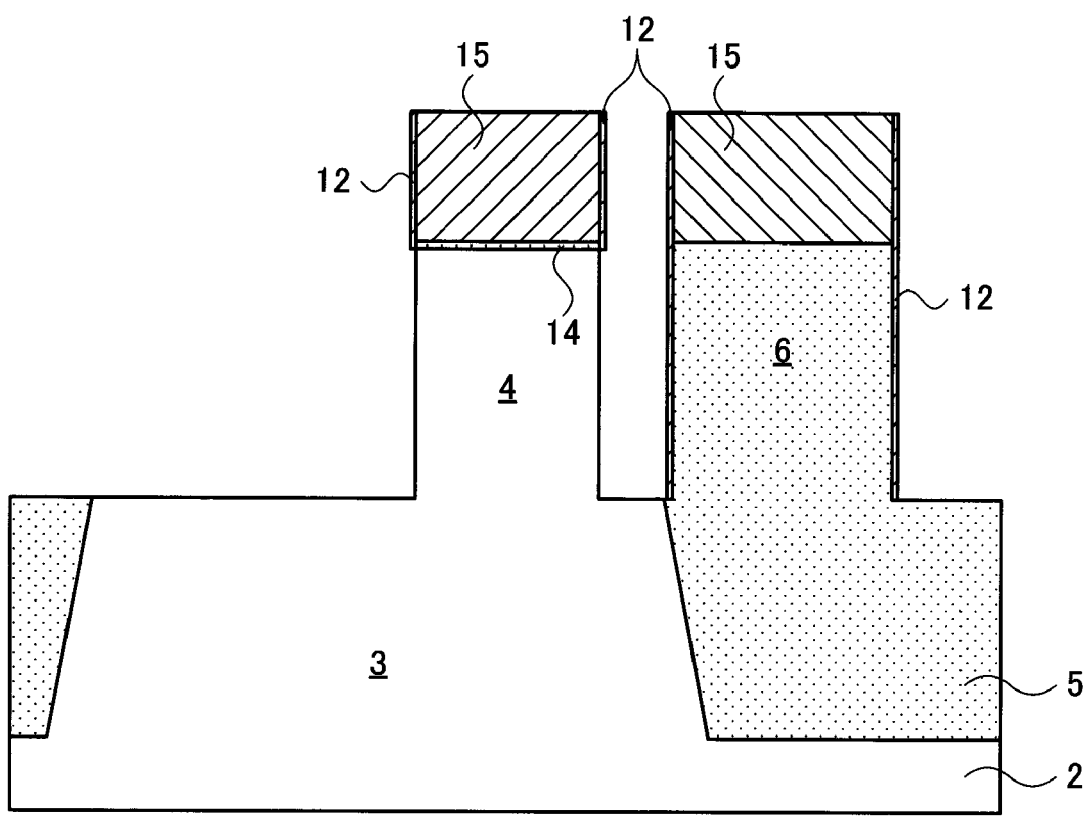

Subsequently, the silicon is selectively etched using the silicon nitride film 15 as a mask pattern to form the secondary silicon pillar 4 (FIG. 6). The height of the lower surface of the secondary silicon pillar 4 is preferably made substantially equal to that of the silicon oxide film pillar 6. According to the present embodiment, appropriately setting the etching condition at this time allows formation of the secondary silicon pillar 4 having the vertical side surface as illustrated in FIG. 6; however, if the protective film 12 is left on the side surface of the primary silicon pillar 3 as illustrated in the comparative example of FIG. 10, it becomes difficult to make the side surface of the secondary silicon pillar 4 vertical because flow of the etchant is hindered.

After the formation of the secondary silicon pillar 4, a washing process of the entire surface of the silicon substrate 2 is performed to remove foreign matters such as etching residues (not illustrated). The washing process is conducted using phosphoric acid or hydrofluoric acid. Though phosphoric acid or hydrofluoric acid has the property of eroding the silicon oxide film, the silicon oxide film pillar 6 is not eroded through the washing process. This is due to the protective film 12 formed on the side surface of the silicon oxide film pillar 6.

Figure 7:
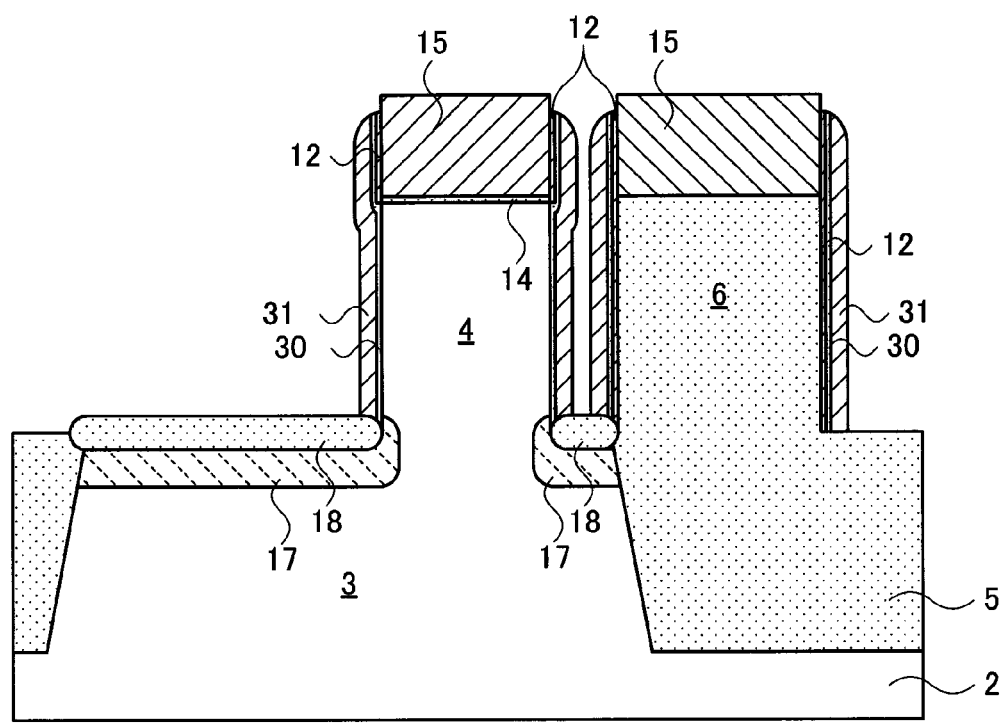

Subsequently, as illustrated in FIG. 7, a silicon oxide film 30 for protection is formed on the side surface of the secondary silicon pillar 4. Concretely, the silicon oxide film 30 may be formed by a CVD method and anisotropic etch back or formed by thermal oxidation and anisotropic etch back. When the CVD method is used, the silicon oxide film 30 is formed also on the side surface of the silicon oxide film pillar 6 as illustrated in FIG. 7.

Further, the CVD method is used to form a silicon nitride film on the entire surface of the silicon substrate 2, followed by anisotropic etch back, whereby a side wall insulating film 31 formed of a silicon nitride film is formed on the side surfaces of the secondary silicon pillar 4 and silicon oxide film pillar 6 (FIG. 7).

After formation of the side wall insulating film 31, the exposed surface of the silicon is subjected to thermal oxidation. As a result, as illustrated in FIG. 7, a silicon oxide film 18 is formed on a region of the upper surface of the primary silicon pillar 3 where the secondary silicon pillar 4 is not formed. Although not particularly limited, the film thickness of the silicon oxide film 18 is preferably set to about 30 nm.

After formation of the silicon oxide film 18, impurities having an opposite conductive type to impurities in the silicon substrate 2 are ion-implanted into the primary silicon pillar 3 through the silicon oxide film 18. As a result, the lower diffusion layer 17 contacting the lower portion of the secondary silicon pillar 4 is formed under the silicon oxide film 18.

Figure 8:
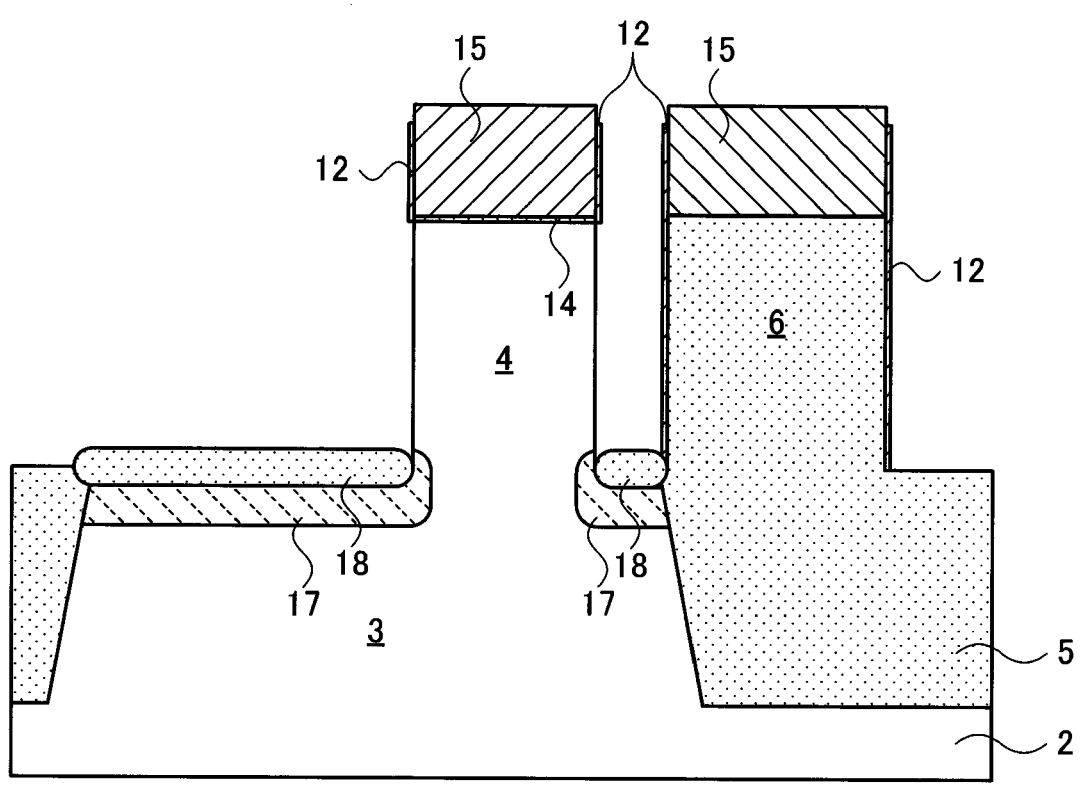

Then, the side wall insulating film 31 and silicon oxide film 30 are sequentially removed by wet etching. As a result, the side surface of the secondary silicon pillar 4 is exposed as illustrated in FIG. 8. The protective film 12 protects the silicon oxide film pillar 6 from being eroded by the wet etching of the silicon oxide film.

Figure 9:
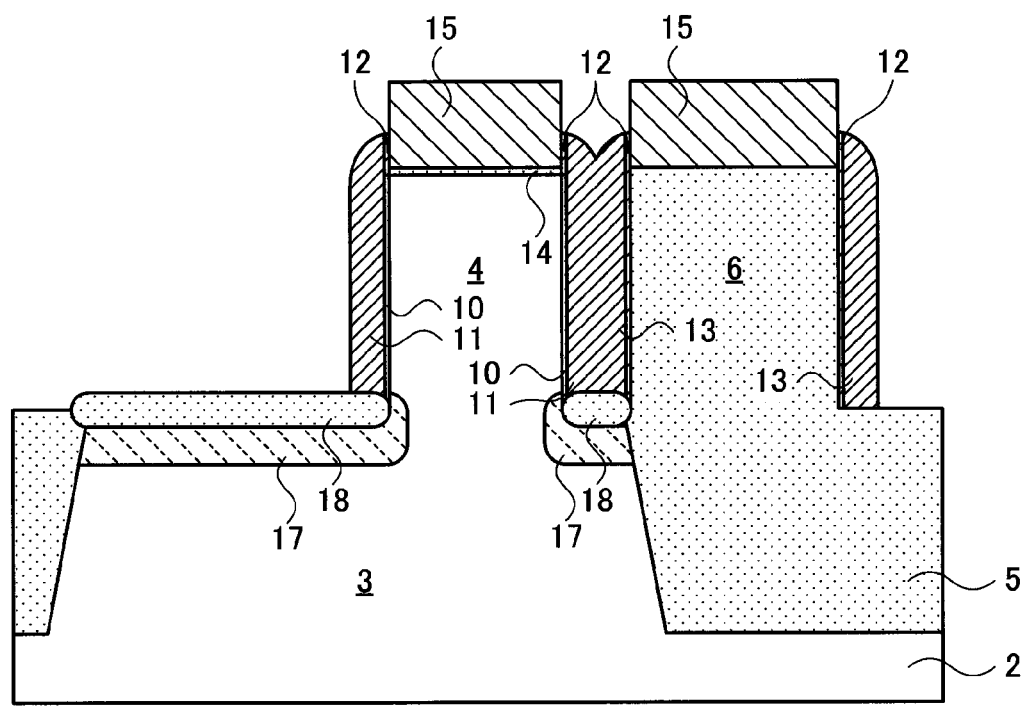

Next, the gate insulating film 10 is formed on the side surface of the secondary silicon pillar 4, and then first and second gate electrodes 11 and 13 each formed of a polysilicon film are formed (FIG. 9). The gate insulating film 10 is preferably formed by thermal oxidation, and the film thickness of the gate insulating film 10 is preferably set to about 5 nm. The first and second gate electrodes 11 and 13 are preferably formed as follows. A polysilicon film having a film thickness of about 30 nm is formed on the entire surface of the silicon substrate 2 by a CVD method, and then the formed polysilicon film is etched back by anisotropic dry etching. As a material of the first and second gate electrodes 11 and 13, not only the polysilicon film but a metal material such as tungsten may be used.

Finally, as illustrated in FIG. 1, the upper diffusion layer 16 is formed, and then the entire surface is covered by the interlayer insulating film 20. Subsequently, the contact plugs 22a to 22c are formed inside the interlayer insulating film 20, whereby a series of the manufacturing process steps are completed. Hereinafter, the above process steps will be described collectively.

First, a silicon oxide film is formed on the entire surface of the silicon substrate 2 by an HDP (High Density Plasma) method, and the resultant surface is polished by a CMP method into a flat surface to form the silicon oxide film 20. At this time, utilizing the silicon nitride film 15 as a stopper enables to control the film thickness of the silicon oxide film 20 reliably.

Then, a mask pattern (not illustrated) is formed on the upper surface of the silicon oxide film 20. The mask pattern is formed so as to expose the upper surface of the silicon nitride film 15 formed on the secondary silicon pillar 4 but cover the other portions. However, in this case, The mask pattern is formed so as to leave a portion of the upper surface of the silicon nitride film 15 having a certain width from the outer circumference covered. The purpose of doing so is to ensure insulation between the upper diffusion layer 16 and the gate electrode 11 by the silicon nitride film 15 and the silicon oxide film 14. The mask pattern is preferably formed of a silicon oxide film formed by a CVD method so as to have a film thickness of about 5 nm.

After formation of the mask pattern, the exposed silicon nitride film 15 is removed by anisotropic dry etching or anisotropic wet etching. Then, a LDD (Lightly Doped Drain) region (not illustrated) is formed at the upper portion of the secondary silicon pillar 4 through the silicon oxide film 14 left on the bottom surface of a through hole formed as a result of removal of the silicon nitride film 15. The LDD region is formed by shallowly ion-implanting low concentrated impurities having an opposite conductive type to impurities in the silicon substrate 2 into the upper surface of the secondary silicon pillar 4.

Then, the silicon oxide film 14 on the bottom surface of the through hole is removed by diluted hydrofluoric acid and, thereafter, silicon is subjected to selective epitaxial growth in the through hole. Subsequently, high concentrated impurities having an opposite conductive type to impurities in the silicon substrate 2 are ion-implanted into the formed silicon epitaxial layer to form the upper diffusion layer 16 as illustrated in FIG. 1.

Then, after removal of the mask pattern, a silicon oxide film is deposited on the entire surface of the silicon substrate 2, and the resultant surface is flattened by a CMP method to form the silicon oxide film 21. Subsequently, patterning is performed to form the first to third contact holes (through holes) 20a to 20c in the silicon oxide films 20 and 21 (FIG. 1). The first contact hole 20a is formed at the position just above the side surface of the silicon oxide film pillar 6 located on the opposite side of the secondary silicon pillar 4 with respect to the silicon oxide film pillar 6 so as to expose the second gate electrode 13. The first contact hole 20a penetrates through the silicon oxide films 20 and 21 to reach the second gate electrode 13. The second contact hole 20b is formed just above the secondary silicon pillar 4 so as to penetrate through the silicon oxide film 21 and to reach the upper diffusion layer 16. The third contact hole 20c is formed in a space area of the upper surface of the primary silicon pillar 3 located next to the secondary silicon pillar 4 so as to penetrate through the silicon oxide films 20, 21, and 18 and to reach the lower diffusion layer 17.

Then, titanium nitride and tungsten are buried in this order into the first to third contact holes 20a to 20c to form the three contact plugs 22a to 22c each constituted by a layered film of titanium nitride and tungsten (FIG. 1). Thereafter, a not-illustrated wiring pattern is formed on the upper layer, whereby the semiconductor device 1 is completed.

As described above, according to the semiconductor device manufacturing method of the present embodiment, the protective film 12 is formed on the side surface of the silicon oxide film pillar 6 serving as a dummy pillar, thus preventing erosion of the silicon oxide film pillar 6 during manufacturing process. Therefore, it is possible to reduce a probability of occurrence of gate electrode disconnection.

The protective film 12 may be formed of a conductive film. In this case, it is possible to reduce the DC resistance of the second gate electrode 13 as compared to a case where the protective film 12 is formed of an insulating film such as a silicon nitride film.

It is apparent that the present invention is not limited to the above embodiments, but may be modified and changed without departing from the scope and spirit of the invention.

For example, in the above embodiment, a configuration in which the silicon pillar and dummy pillar are provided in one-to-one correspondence has been described; however, the present invention may be applied to a configuration in which one dummy pillar is provided in common to a plurality of silicon pillars. That is, in this case, the side surface of the one dummy pillar is covered by the protective film 12. As a concrete example of such a dummy pillar, a dummy pillar used for extension of a word line in a memory cell region of a DRAM can be taken.

Further, in the above embodiment, a configuration in which the STI region 5 and insulating pillar 6 are each formed of a silicon oxide film has been described. However, the present invention may be applied to a configuration in which the STI region 5 and insulating pillar 6 are each formed of an insulating material other than the silicon oxide film. In this case, the protective film 12 is preferably made to differ from this insulating material in etching condition. That is, a material harder to erode during manufacturing process of the semiconductor device than this insulating material is preferably used as the protective film 12.

Further, the present invention is also applicable to semiconductor devices other than the DRAM. That is, the present invention is applicable to a transistor in which the dummy pillar is used to extend the length of the gate electrode.

What is claimed is:

1. A manufacturing method of a semiconductor device comprising:
   forming an insulating pillar on a main surface of a silicon substrate;
   forming a protective film on a side surface of the insulating pillar;
   forming a silicon pillar on the main surface of the silicon substrate with covering the side surface of the insulating pillar by the protective film;
   forming a gate insulating film on a side surface of the silicon pillar; and
   forming first and second gate electrodes contacting each other and covering the side surfaces of the silicon pillar and insulating pillar, respectively.

2. The manufacturing method as claimed in claim 1, wherein
   the insulating pillar comprises a silicon oxide, and
   the protective film comprises a material different from the silicon oxide in etching condition.

3. The manufacturing method as claimed in claim 2, further comprising acid washing an entire surface of the silicon substrate, wherein the protective film comprises a material less eroded by the acid washing than the silicon oxide.

4. The manufacturing method as claimed in claim 2, further comprising applying wet etching to the silicon oxide after formation of the protective film, wherein the protective film comprises a material having a lower etching rate for the wet etching than the silicon oxide.

5. The manufacturing method as claimed in claim 2, wherein the protective film comprises a silicon nitride.

6. The manufacturing method as claimed in claim 2, wherein the protective film comprises a conductive material.

7. The manufacturing method as claimed in claim 1, further comprising:
   forming a primary silicon pillar by etching the main surface of the silicon substrate; and
   forming an element isolation region comprising an insulating material around the primary silicon pillar, wherein
   the insulating pillar is formed by etching the element isolation region, and
   the silicon pillar is formed by etching the primary silicon pillar.

8. The manufacturing method as claimed in claim 7, wherein the forming the protective film includes:
   covering an entire surface of the silicon substrate with the protective film; and
   removing the protective film except for a portion formed on the side surface of the insulating pillar.

9. The manufacturing method as claimed in claim 8, wherein
   the removing the protective film is performed by anisotropic etch back,
   an inclination of the side surface of the primary silicon pillar relative to the main surface of the silicon substrate is set such that the protective film formed on the side surface of the primary silicon pillar is removed by the anisotropic etch back, and
   an inclination of the side surface of the insulating pillar relative to the main surface of the silicon substrate is set such that the protective film formed on the side surface of the insulating pillar is not removed by the anisotropic etch back.

10. The manufacturing method as claimed in claim 1 further comprising:
    forming a lower diffusion layer on a lower portion of the silicon pillar;
    forming an upper diffusion layer on an upper portion of the silicon pillar;
    forming an interlayer insulating film covering an entire surface of the silicon substrate;
    forming three contact holes in the interlayer insulating film exposing the second gate electrode, upper diffusion layer, and lower diffusion layer, respectively; and
    forming contact plugs respectively in the three contact holes.

* * * * *